United States Patent [19]

Dillon

[11] Patent Number: 4,554,466
[45] Date of Patent: Nov. 19, 1985

[54] EDGE-TRIGGERED LATCH CIRCUIT CONFORMING TO LSSD RULES

[75] Inventor: Gary E. Dillon, Tucson, Ariz.

[73] Assignee: International Business Machines Corp., Armonk, N.Y.

[21] Appl. No.: 445,888

[22] Filed: Dec. 1, 1982

[51] Int. Cl.[4] ...................... H03K 3/284; H03K 17/56
[52] U.S. Cl. ............................... 307/272 A; 307/530; 307/247 R; 307/445
[58] Field of Search ............... 307/272 A, 272 R, 445, 307/530, 247 R; 377/73

[56] References Cited

U.S. PATENT DOCUMENTS 3,761,695  5/1973  Eichelberger .................. 371/25
4,277,699  7/1981  Brown et al. .................. 377/73
4,313,199  1/1982  Aichelmann, Jr. et al. ........ 371/25

*Primary Examiner*—Stanley D. Miller
*Assistant Examiner*—B. P. Davis
*Attorney, Agent, or Firm*—James M. Thomson

[57] ABSTRACT

An improved latch capable of operation in an edge-triggered, data-handling mode and in an LSSD clocked mode. The latch generally comprises a polarity hold latch L1 connected to a polarity hold latch L2. The −C clock input of the latch is tied to the +B clock via an OR invert gate. Thus, during the loading of the L1 latch and data transferred to the L2 latch, the loading and transfer of false data is eliminated, while the latch otherwise conforms to LSSD rules and can be tested accordingly.

7 Claims, 4 Drawing Figures

EDGE-TRIGGERED LATCH CIRCUIT CONFORMING TO LSSD RULES

FIELD OF THE INVENTION

This invention relates to an edge-triggered latch circuit which conforms with LSSD rules as disclosed in U.S. Pat. No. 3,761,695.

DESCRIPTION OF THE PRIOR ART

U.S. Pat. No. 4,063,078 describes a clock generation network for generating at least a pair of nonoverlapping clock trains from a single oscillator input. The network complies with so-called level sensitive scan design (LSSD) rules which are, in turn, described in U.S. Pat. Nos. 3,761,695; 3,783,254 and 3,784,907.

A logic network designed within the LSSD rules generally requires that sequential logic be controlled by two or more nonoverlapping clock trains. The purpose of LSSD is to enable logic networks embodied in large scale integrated semiconductor devices to be adequately tested. The clock generation network of the aforementioned U.S. Pat. No. 4,063,078 has the advantage that it is fully testable, it can be integrated upon the same semiconductor chip as logic circuits conforming to the LSSD rules, and during the test a system can generate tests for the clock network as well as for the logic network it controls.

U.S. Pat. No. 4,277,699 discloses a latch circuit operable as a D type edge-triggered circuit, which also is intended to conform to the LSSD rules mentioned above. The latter patent discloses a latch circuit comprised of a polarity hold latch connected to a set/reset latch. During system operation, the shift register latch circuit operates as a D type edge-trigger by connecting the clock input +B of the set/reset latch to the clock −C supplied to the polarity hold latch. This connection is illustrated by dotted line 14 in FIG. 4 of the aforementioned patent.

In theory such a direct connection is valid. However, it directly violates LSSD architecture requirements. In order to circumvent this violation, the design of the '699 patent is generally implemented by connecting the −C clock to the +B clock at the board, not the chip or card level.

It has now been found that the delay imparted to signals through such off-chip connections, as well as the delay inherent in the clock driver circuits of the illustrated configuration, can result in latching of false data in the L2 latch in certain situations.

A further disadvantage of the '699 patent connection is the usage of a two chip I/O and two card I/O arrangement for each unique edge-triggered latch implementation.

SUMMARY OF THE INVENTION

Accordingly, an object of the present invention is to provide an improved latch circuit which can operate as an edge-triggered latch that conforms to LSSD design rules, eliminates the possibility of latching and transferring false data, and eliminates the need for utilizing chip and card I/O for implementing the edge-triggered function.

According to the invention, a shift register latch operable as an edge-trigger device comprises a data input latch in the form of a polarity hold latch and a data output latch in the form of another polarity hold latch connected to the output of the first polarity hold latch. The circuit otherwise includes means operable during testing under LSSD design rules for clocking the data output latch with different and nonoverlapping clock signals to that of the polarity hold latch. Other means are provided during data operation of the shift register latch in an edge-triggered mode, for clocking the polarity hold latch and the data output latch with the same clock signal. In this situation the −C clock of the polarity hold latch is connected to the +B clock input through an OR invert gate to provide an overriding control signal to the data output latch to prevent transfer of false data to the data output latch. The gate connection is made in a manner which positively controls the latch input and output states and overcomes the problems encountered with the latch illustrated in U.S. Pat. No. 4,277,699.

BRIEF DESCRIPTION OF THE DRAWINGS

The invention will now be particularly described with reference to the accompanying drawings in which.

DESCRIPTION OF THE PREFERRED EMBODIMENT

Figure 1:
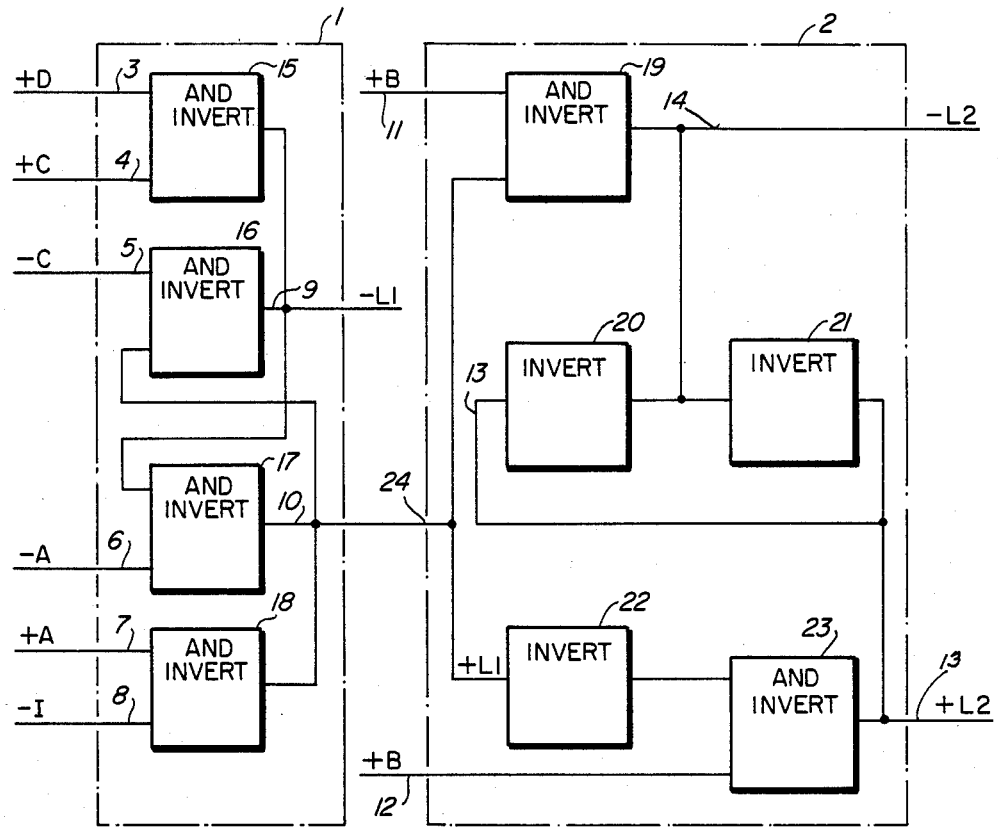
FIG. 1 is a diagram showing the basic L1-L2 shift register latch configuration utilized in the invention.

Referring now to FIG. 1, a shift register latch circuit consists of a polarity hold latch 1 connected to a polarity hold latch 2. The polarity hold latch 1 has a +D input 3 for receiving data, a −I input 8 for receiving test data, +C and −C clock inputs 4 and 5 for clocking the +D data input, and −A and A clock inputs 6 and 7 for clocking the −I scan data input. The polarity hold latch 1 has −L1 output 9 and +L1 output 10.

The L2 portion of the shift register latch 2 is a polarity hold latch. It has a data input I 24 connected to the output line 10 of polarity hold latch 1. Two +B clocks on lines 11 and 12 provide the clocking of data into polarity hold latch 2. +L2 and −L2 data output are taken out on lines 13 and 14 respectively.

Figure 2:
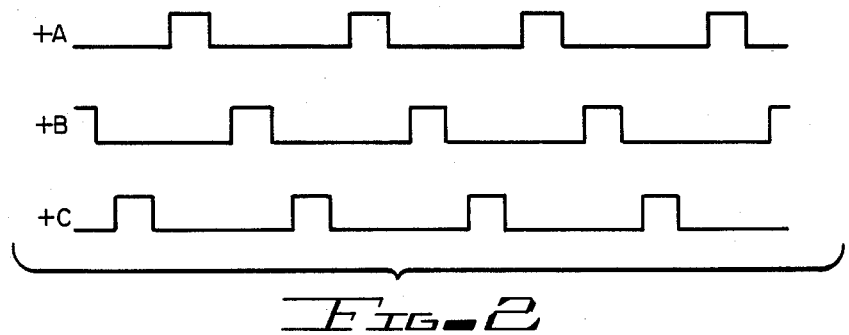
FIG. 2 illustrates the timing diagram for three nonoverlapping A, B and C clock.

The clock trains +A, +B and +C are shown in FIG. 2. It will be seen that the clock trains +A, +B and +C are nonoverlapping, that is a clock signal will not appear simultaneously with another clock signal. The +C and −C clock signals are obtained, in our embodiment, using a clock driver circuit depicted in FIG. 3.

This means that the shift register latch shown in FIG. 1 conforms to the Level Sensitive Scan Design (LSSD) rules referred to above. Thus, the polarity hold latch 1 is clocked by a clock train which is independent of the clock train which clocks the polarity hold latch 2. Accordingly, the circuit can be readily tested by automatically generated test patterns applied to the scan input 8 as described in the aforementioned patent specification.

Briefly however, the C clock is used to set conditions into the polarity hold latch, and then test patterns are scanned through the latch circuit using the A and B clocks. During scanning the C clock is not used.

Figure 3:
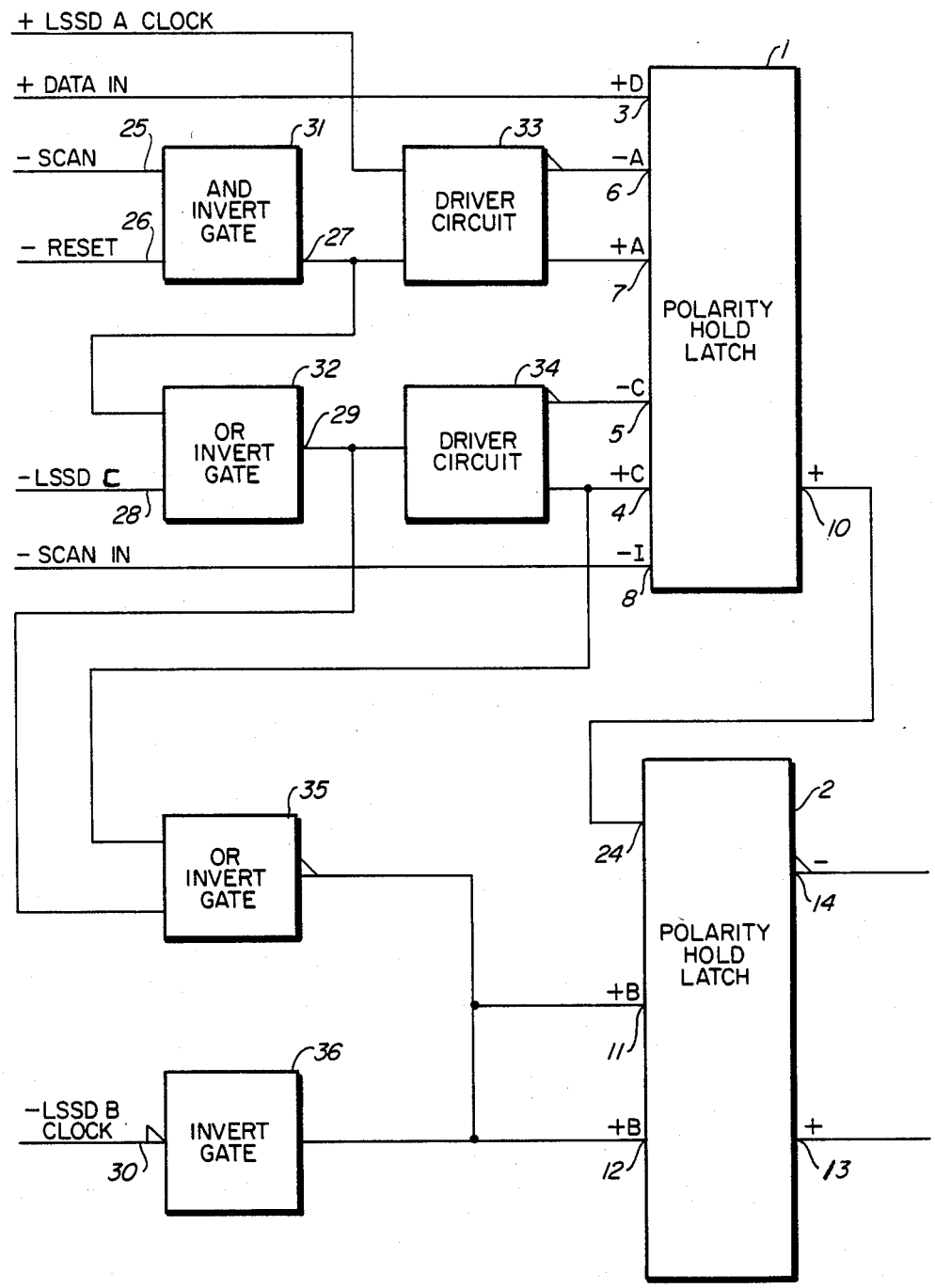
FIG. 3 is a block diagram of a shift register latch illustrating the invention.

Referring now to the drawings and particularly to FIG. 3, a preferred embodiment of the invention is illustrated. A shift register latch circuit is illustrated including a polarity hold latch 1 connected to a polarity hold latch 2. The polarity hold latch has a Scan-In input 8 and a Data-In input 3. In addition the latch has dual A Clock inputs 6, 7 and dual C Clock inputs 4, 5. The polarity hold latch also has a Data output 10 which is interconnected with a Data input 24 of the data output latch 2. The polarity hold latch 2 otherwise includes dual B Clock inputs 11, 12 and dual outputs 13, 14.

On the left side of FIG. 3, input lines to the latch circuit are illustrated including the Data-In line and Scan-In line previously described as being associated with the polarity hold latch. In addition, LSSD A clock, B clock and C clock signals are provided. Also a Scan input and a Reset or preset input are provided. These input signals are interconnected with the polarity hold latches by various driver circuits and gates described hereinafter. The relative polarity of each of the input signals is shown on the left side of FIG. 3, and will be described hereinafter with positive signals being designated as high and negative signals as low. However, it should be recognized that one or ordinary skill could utilize reverse clocking arrangements without departing from the scope of the invention.

The Scan and Reset inputs are received as dual inputs to an AND invert circuit 31. The AND invert circuit has an output on conductor 27 that serves as an input to a clock driver circuit 33. The LSSD A clock signal is received as the other input to the clock driver circuit. As illustrated, the clock driver provides an inverted output that serves as the −A input to the polarity hold latch and a noninverted output which serves as the +A input to the polarity hold latch.

The output of gate 31 also is connected one input of an OR invert circuit 32. As shown, the LSSD C clock provides a second input to the gate 32. Gate 32 has an output on conductor 29 that comprises a single input to driver circuit 34.

Driver circuit 34 is provided with a noninverting output which comprises the +C clock input to polarity hold latch and an inverted output which comprises the −C input to the polarity hold latch.

It should be recognized that AND invert gate 31 provides a low output when both of the inputs are in a high state and a high output for all other input combinations. By the same token, gate 32, the OR invert circuit, provides a high output when both inputs are in a low state and a low output for all other input combinations.

Again as shown, the LSSD B clock serves as a single input to an inverted gate 36 which has an output connected with both of the B clock inputs of data output latch 2. The latch circuit otherwise includes an OR invert gate 35 which has a dual input and an inverted output. One input of gate 35 is connected to the noninverting output of driver circuit 34 comprising the +C clock. The other input of gate 35 is connected to the output of gate 32. The inverted output of gate 35 is connected to each of the B clock inputs of polarity hold latch 2.

It should be recognized that clock trains associated with the LSSD A clock, B clock and C clock signals are used to perform LSSD testing upon the latch circuit in conventional fashion. Thus, nonoverlapping clock trains are normally provided which will be shifted through the logic circuitry of the latch and will reappear on the output terminals of the latch in an altered state, if the circuitry operates correctly. In the usual fashion, the polarity hold latch is clocked by a clock train which is independent of the clock train that clocks polarity hold latch 2. Accordingly, the circuits can be readily tested by automatically generated test patterns applied to the scan input as described in the aforementioned patents.

During system operations, the Reset signals, Data-In and Scan-In signals are used to operate the circuit as an edge-triggered latch. The various gating and driver arrangements are intended to enable the latch to perform in edge-triggered mode without latching or transferring false data. The manner of operation will be described hereinafter in connection with the wave diagrams of FIG. 4.

Figure 4:
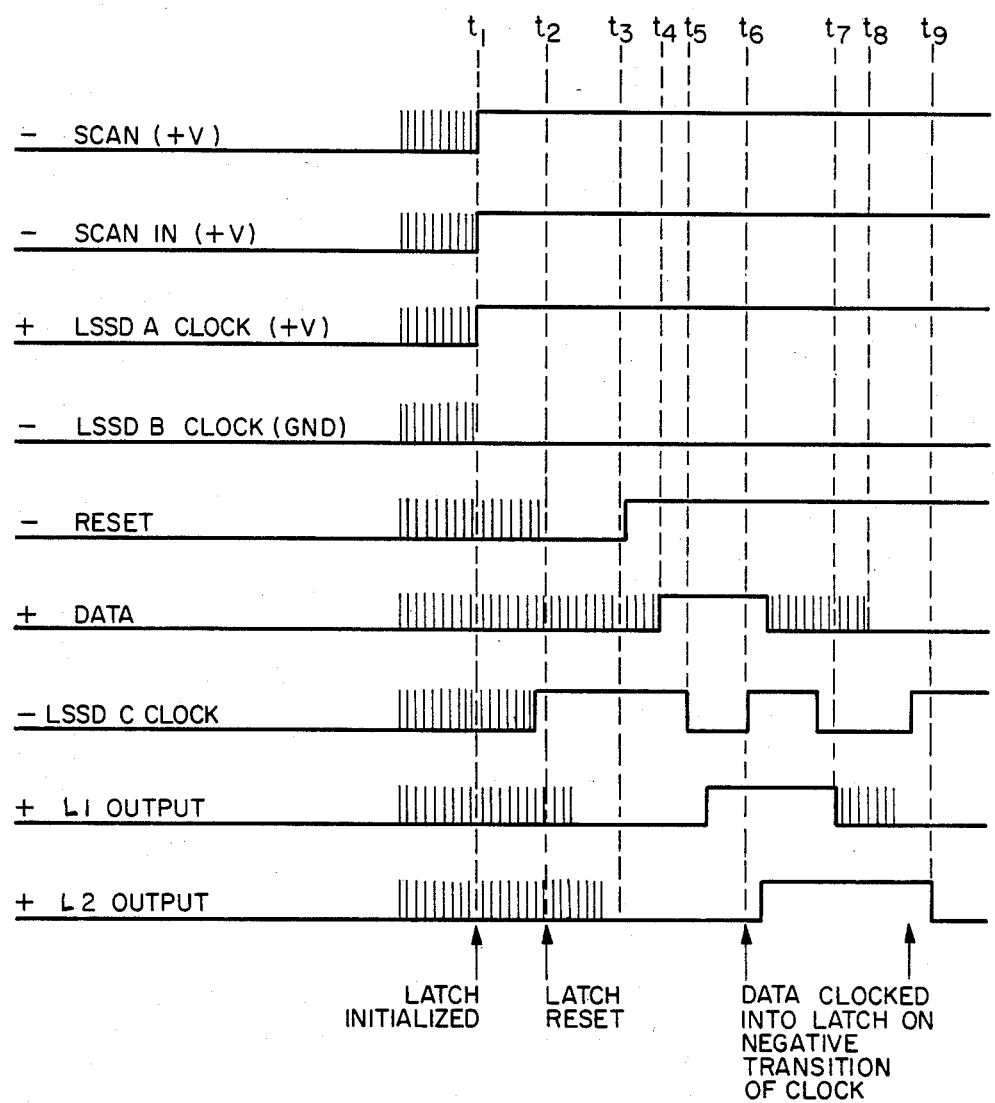
FIG. 4 is a timing diagram showing the relationship between various clock and data signals when the circuit of FIG. 3 is operated.

Referring to FIG. 4, the various states of the input lines and latch outputs are illustrated at various times. The hashed areas of the figure are intended to indicate intervals where a given state of the input signal or latch is uncertain, i.e. in the case of the data or output signals, jitter might be occurring. The wave forms show the latch being initialized at a time t1 with the Scan, Scan-In and LSSD A clock being at high level. The LSSD B clock is at a low level. The Scan-In signal functions as a latch reset signal. Therefore when the Reset signal goes active low then the states of the polarity hold latch 1 and polarity hold latch 2 go low as illustrated in the figure at t2. It should be recognized that the state changes of latch 1 and latch 2 occur at a slightly delayed time after the Reset signal changes.

At time t3 when the Reset signal goes inactive high, then latch 1 and latch 2 are both ready for operation as a negative edge-triggered latch. Consequently, when the Data signal goes active high at t4 and the C clock goes active low at time t5, then active data is transferred to latch 1 which changes state as illustrated in the figure, at a short time after t5. Latch 2 cannot change state because the C clock is still active. Consequently, the B clock input to latch 2 is still in an inactive low state and this prevents latch 2 from changing state.

At time t6 the C clock goes inactive high. This results in degating the data to latch 1. It also results in the B clock input to latch 2 becoming active high as a result of the change in state of OR invert gate 35. Consequently, the data latched in latch 1 is transferred to latch 2. It should be recognized that this is accomplished in a positive control state. Thus, with the clock in an inactive high state data, jitter will not change the state of either latch 1 or latch 2.

At time t7, the C clock returns to an active low state and the data is still jittering. Thus, latch 1 follows the data line, i.e. it jitters also. However, the latch 2 output is unaffected by this jitter. After a certain time illustrated as t8 in the figure, the data jitter terminates and the state of data and the latch 1 output will go low. Then at time t9 the C clock goes to an inactive high state and data is again transferred to latch 2.

Thus it should be recognized that the operation of gate 32 and driver circuit 34 along with gate 35 results in positive control of the latch to avoid latching or transfer of false data. This occurs even though some time delay is imparted to the C clock signal by driver circuit 34. Thus, the C clock output signal from gate 32 to gate 35 functions as an overriding control signal when the data is transferred to latch 1. Then, the C clock output from driver circuit 34 to gate 35 positively controls transfer of data from latch 1 to latch 2. This eliminates the problems due to external time delay as well as driver circuit time delay in operating edge-triggered latches according to LSSD rules.

What is claimed is:

1. An integrated circuit latch configuration conforming to level sensitive scan design rules including:
   a first polarity hold latch having a data input, an input for receiving a first clock pulse train, another input for receiving a second clock pulse train, and an output,
   a second polarity hold latch having an input connected to the output of said first polarity hold latch, an input for receiving a third clock pulse train, and an output,
   gate means connected to the second clock pulse train input for disabling the third clock pulse train input to the second latch when a data pulse is transferred to the first latch, and
   circuit means connected to the second clock pulse train input for enabling the third clock pulse train input to the second latch when the data pulse and the second clock train pulse terminate, whereby data is positively transferred from the first latch to the second latch.

2. The circuit of claim 1 wherein said gate means includes a first or invert gate having an output connected to the third clock pulse train input of the second latch and two inputs,
   a second or invert gate receiving the second clock pulse train as an input and having an output connected to the input of said first gate, and
   a driver circuit receiving an input from the output of the second gate and having an output connected to the second clock pulse train input of the first latch and to the other input of said first gate.

3. The circuit of claim 2 further including an invert gate having an input connected to the third clock pulse train and an output connected to the third clock pulse train input of the second latch.

4. The circuit of claim 3 further including a driver circuit receiving the first clock pulse train input and having an output connected to the first clock pulse train input of the first latch.

5. An integrated circuit latch configuration conforming to level sensitive scan design rules including:
   a first polarity hold latch having a data input, dual inputs for receiving a first clock pulse train and its complement, second dual inputs for receiving a second clock pulse train and its complement, and an output,
   a second polarity hold latch having an input connected to the output of said first polarity hold latch, a third pair of inputs for receiving a third clock pulse train and its complement, and an output,
   a driver circuit connected to the first pair of dual inputs having an input for the first clock pulse train and providing two outputs to the first polarity hold latch comprising the first clock pulse train and its complement,
   a second driver circuit connected to the first latch, having an input that receives the second clock pulse train signal and having two outputs that provide the second clock pulse train signal and its complement to the first latch,
   an OR invert gate connected between the second clock pulse train signal and the input of the driver circuit,
   a second OR invert gate having a first input connected to the output of the first OR invert gate and a second input connected to the complement output of the second driver circuit and an output connected to the third clock pulse train input of the second latch.

6. The circuit of claim 5 further including an invert gate adapted to receive the third clock pulse train and having an output connected to the second clock pulse train input of the second latch.

7. The circuit of claim 6 further including an AND invert gate adapted to received scan and reset signals and having an output connected to the input of the first OR invert gate and the first driver circuit.

* * * * *